US008643087B2

(12) United States Patent
Sandhu et al.

(10) Patent No.: US 8,643,087 B2
(45) Date of Patent: Feb. 4, 2014

(54) REDUCED LEAKAGE MEMORY CELLS

(75) Inventors: Gurtej S. Sandhu, Boise, ID (US);
Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1294 days.

(21) Appl. No.: 11/524,343

(22) Filed: Sep. 20, 2006

(65) Prior Publication Data

US 2008/0068876 A1 Mar. 20, 2008

(51) Int. Cl.
*H01L 29/10* (2006.01)
(52) U.S. Cl.
USPC .................................. 257/329; 257/E29.052
(58) Field of Classification Search
None
See application file for complete search history.

(56) References Cited

U.S. PATENT DOCUMENTS

| 5,208,172 | A | 5/1993 | Fitch et al. | |
|---|---|---|---|---|
| 5,899,734 | A | 5/1999 | Lee | |
| 6,130,142 | A * | 10/2000 | Westwater et al. | 438/478 |
| 6,246,083 | B1 | 6/2001 | Noble | |
| 6,337,497 | B1 * | 1/2002 | Hanafi et al. | 257/306 |
| 6,534,824 | B1 | 3/2003 | Mandelman et al. | |
| 6,798,000 | B2 * | 9/2004 | Luyken et al. | 257/213 |
| 7,120,046 | B1 | 10/2006 | Forbes | |
| 7,411,241 | B2 * | 8/2008 | Kim et al. | 257/306 |
| 7,489,003 | B2 * | 2/2009 | Rhie | 257/302 |
| 2002/0001905 | A1 | 1/2002 | Choi et al. | |
| 2002/0034855 | A1 | 3/2002 | Horiguchi et al. | |
| 2003/0132461 | A1 | 7/2003 | Roesner et al. | |
| 2004/0157353 | A1 * | 8/2004 | Ouyang et al. | 438/38 |
| 2004/0240245 | A1 * | 12/2004 | Kenny et al. | 363/144 |
| 2005/0012089 | A1 * | 1/2005 | Senzaki et al. | 257/40 |
| 2005/0164454 | A1 | 7/2005 | Leslie | |
| 2005/0167755 | A1 * | 8/2005 | Dubin et al. | 257/368 |
| 2005/0184348 | A1 * | 8/2005 | Youn et al. | 257/401 |
| 2005/0224888 | A1 | 10/2005 | Graham et al. | |
| 2006/0046391 | A1 | 3/2006 | Tang et al. | |
| 2006/0046407 | A1 | 3/2006 | Juengling | |
| 2006/0273389 | A1 * | 12/2006 | Cohen et al. | 257/331 |
| 2007/0052012 | A1 | 3/2007 | Forbes | |

FOREIGN PATENT DOCUMENTS

| CN | 1658401 A | 8/2005 |
|---|---|---|
| JP | 11008366 A | 1/1999 |
| JP | 2002083945 A | 3/2002 |
| JP | 2005197612 A | 7/2005 |
| JP | 2006049925 A | 2/2006 |

(Continued)

OTHER PUBLICATIONS

Black, C. T., "Self-aligned self assembly of multi-nanowire silicon field effect transistors", *Applied Physics Letters*, 87, (2005),163116-1-163116-3.

(Continued)

*Primary Examiner* — Benjamin Sandvik
(74) *Attorney, Agent, or Firm* — Schwegman, Lundberg & Woessner, P.A.

(57) ABSTRACT

Methods and structures are described for reducing leakage currents in semiconductor memory storage cells. Vertically oriented nanorods may be used in the channel region of an access transistor. The nanorod diameter can be made small enough to cause an increase in the electronic band gap energy in the channel region of the access transistor, which may serve to limit channel leakage currents in its off-state. In various embodiments, the access transistor may be electrically coupled to a double-sided capacitor. Memory devices according to embodiments of the invention, and systems including such devices are also disclosed.

28 Claims, 9 Drawing Sheets

(56) References Cited

FOREIGN PATENT DOCUMENTS

| WO | WO-03083919 A2 | 10/2003 |
|---|---|---|
| WO | WO-2004040616 A2 | 5/2004 |
| WO | WO-2006031981 A2 | 3/2006 |
| WO | WO-2007120493 A1 | 10/2007 |
| WO | WO-2008036371 A2 | 3/2008 |

OTHER PUBLICATIONS

Guarini, K. W., "Nanoscale patterning using self-assembled polymers for semiconductor applications", *J. Vac. Sci. Technol. B*, 19(6), (Nov.-Dec. 2001),2784-2788.

Guarini, K. W., "Process integration of self-assembled polymer templates into silicon nanofabrication", *J. Vac. Sci. Technol. B*, 20(6), (Nov.-Dec. 2002),2788-2792.

Ma, D. D., et al., "Small-diameter silicon nanowire surfaces", *Science*, 299(5614), (Mar. 21, 2003),1874-1877.

Suk, Sung D., et al., "High performance 5nm radius Twin Silicon Nanowire MOSFET (TSNWFET) : fabrication on bulk si wafer, characteristics, and reliability", *IEEE International Electron Devices Meeting, 2005. IEDM Technical Digest.*, (2005),717-720.

Goebel, B., et al., "Fully depleted surrounding gate transistor (SGT) for 70 nm DRAM and beyond", *International Electron Devices Meeting 2002. IEDM. Technical Digest.* San Fransisco, CA, Dec. 8-11, 2002, New York, NY:IEEE, US., ISBN: 0-7803-7462-2, (Dec. 8, 2002), 275-278.

Paolo, G. A, "An overview of the 2001 International Technology Roadmap for Semiconductors", *IEEE Circuits and Devices Magazine, IEEE Service Center*, Piscataway, NJ, US, vol. 18(2), ISSN: 8755-3996, (Mar. 2002), 13-17.

Gargini, Paolo, "An Overview of the 2001 International Technology Roadmap for Semiconductors", *IEEE Circuits and Devices Magazine*, 18(2), XP011092714, (2002), 13-17.

Goebel, B, et al., "Fully depleted surrounding gate transistor (SGT) for 70 nm DRAM and beyond", *International Electron Devices Meeting*, 2002. IEDM '02. Digest., (2002), 275-278.

"Chinese Applicaiton Serial No. 200780034711.9, Office Action mailed Mar. 19, 2012", w/English Translation, 9 pgs.

"Chinese Application Serial No. 200780034711.9, Office Action mailed Oct. 23, 2012", 10 pgs.

"Chinese Application Serial No. 200780034711.9, Office Action Response Filed May 29, 2012", CN Translation Only, 5 Pgs.

"European Application Serial No. 07838585.3, Office Action mailed Sep. 6, 2012", 4 pgs.

"Taiwan Application Serial No. 096135135, Response filed Sep. 26, 2012 to Office Action mailed Jun. 27, 2012", 12 pgs.

"Taiwan Application Serial No. 096135135, Office Action mailed Jun. 27, 2012", 12 pgs.

"Taiwanese Application Serial No. 096135135, Response filed Jan. 10, 2012 to Office Action mailed Jun. 28, 2011", 3 pgs.

Cui, Yi, et al., "High Performance Silicon Nanowire Field Effect Transistors", Nano Letters, 3(2), (2003), 149-152.

"Chinese Application Serial No. 200780034711.9, Response filed Feb. 6, 2013 to Office Action mailed Oct. 23, 2012".

"European Application Serial No. 7838585.3, Response filed Jan. 16, 2013 to Office Action mailed Sep. 6, 2012", 11 pgs.

"Japanese Application Serial No. 2009-529241, Office Action maiied Jan. 8, 2013", 4 pgs.

\* cited by examiner

REDUCED LEAKAGE MEMORY CELLS

TECHNICAL FIELD

The information disclosed herein relates generally to embodiments of semiconductor devices, including memory cells.

BACKGROUND

The semiconductor device industry has a market-driven need to reduce the size of devices used, for example, in dynamic random access memories (DRAMs) that are found in computers and mobile communications systems. Currently, the industry relies on the ability to reduce or scale the dimensions of its basic devices to increase device density. This includes scaling the channel length of the metal oxide semiconductor field effect transistor (MOSFET). Increased channel scaling of the MOSFET can lower the channel resistance. Consequently, channel leakage currents may increase. This relationship has made the present MOSFET channel design less useful for providing increasingly smaller memory cells, and thus, there is a need to find other mechanisms to generate reduced cell geometry.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in this document.

DETAILED DESCRIPTION

Figure 1A:
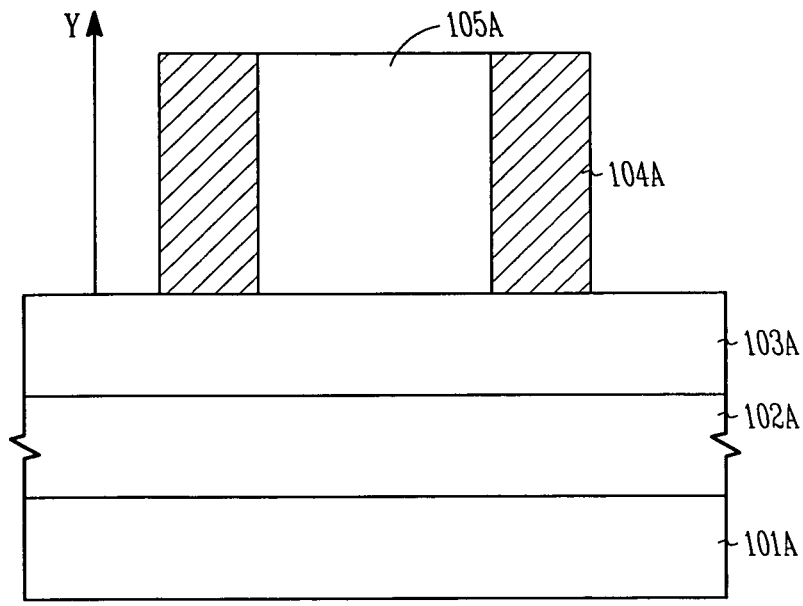
FIGS. 1A-C are cross-sections illustrating nanorod formation according to various embodiments of the invention.

One approach to increasing the on-chip storage capacity of a semiconductor is to increase the number of capacitor cells per unit area, which generally means reducing the overall size of the capacitor. However, reducing capacitor size may result in a lower capacitance per cell. If the lower cell capacitance means more capacitive elements are needed to maintain or improve upon a performance characteristic, such as the ability to maintain a storage charge over time, then any gain in capacitor density may be offset. The double-sided capacitor provides one useful device structure for increasing capacitance without a commensurate increase in area. A double-sided capacitor may be scaled smaller, for example, by increasing the dielectric constant of the insulator material separating the capacitor plates.

A double-sided capacitor used for a DRAM memory cell is typically coupled to an access transistor located in close proximity. For performance reasons and to maximize cell density, the access transistor and the double-sided capacitor may be formed in a stacked capacitor-transistor arrangement. A continued reduction in the size of the double-sided capacitor for such an arrangement then, may involve further reduction (or scaling) in the access transistor. In the case of a MOSFET, scaling smaller typically means reducing the channel length as well as channel width, which may lead to lower drain-source resistance ($r_{ds}$). Lower $r_{ds}$, may allow higher off-state leakage currents to flow between the drain and source. A lower $r_{ds}$ may result from an increase in the channel conduction due to a short channel effect such as drain induced barrier lowering (DIBL). Near the channel inversion threshold, a potential barrier may be formed between the source and the channel blocking drain current flow. The application of a drain voltage may decrease the potential barrier height between the source and channel, increasing the drain current at near and below threshold. The drain current may therefore be due to the drain voltage as well as the gate voltage, effectively reducing $r_{ds}$ at near or below the inversion threshold. A higher gate leakage current may also occur at shorter channel lengths due to the higher gate electric fields. Many embodiments of the invention may operate to reduce the leakage currents as the channel length is reduced.

The bulk (or native) band gap energy of a semiconductor material is the energy separation between the conduction and valance bands having a three dimensional continuum of energy states. A semiconductor material with a three dimensional continuum of energy states does not, generally, exhibit substantial quantum size effects such as discrete energy levels, spin-orbit splitting of heavy and light hole bands and changes in band gap separation. Quantum size effects may be introduced by altering a crystal's dimensions. A change in the physical dimensions of a single crystal semiconductor material does not generally change the bulk band gap energy of the material, if all three crystal dimensions are sufficiently large. Conversely, reducing the size of a semiconductor material may cause the band gap energy of the material to increase or shift to higher energy, if at least one of the three crystal dimensions is made sufficiently small. For example, a rod shaped from semiconductor material may cause the energy band gap of the material to increase above its bulk band gap energy state as the diameter or the length of the rod is reduced. The change in the energy band gap of a rod-shaped material caused by its small dimensions may be exploited. A rod with a diameter on the order of a nanometer may be termed a "nanorod".

In many embodiments, vertical transistor channels are formed using one or more semiconductor nanorods oriented substantially perpendicular to a surface of a substrate. In some cases, the channels comprise a nanorod shape. In some cases, the channel region is formed using multiple nanorods. And in some cases, a nanorod includes the channel region.

Nanorods offer alternatives to the designers of MOSFET-based devices since the geometry can be used to alter the electronic properties of the MOSFET channel using quantum size effects. As the diameter of the nanorod channel is reduced, a shift in the density of states, from a three-dimensional continuum of states to a two-dimensional density of states in the channel region may occur. Consequently, the electron and hole effective mass may be reduced and the band gap energy of the semiconductor material may increase in the channel. The lower effective masses of the charge carriers may provide improved carrier transport properties such as higher carrier mobilities. A MOSFET channel with a higher band gap energy may provide a low leakage current between source and drain regions, a lower gate-channel leakage current and a faster switching speed.

A common MOSFET channel material is single crystal silicon. Silicon is a material where the electronic band gap increases as the physical size of the crystal decreases. For a MOSFET with a silicon vertical electron channel shaped as a nanorod, or a silicon vertical electron channel formed with multiple nanorods, reducing the diameter of the nanorod, for example from 13 nm to 7 nm, increases the band gap energy at room temperature from its bulk (or native) band gap energy of 1.12 eV to 3.5 eV. Additional energy band gap separation may be possible by decreasing the nanorod diameter ever further. Lowering the surface state density of the channel along the side of the nanorod using a dielectric or a semiconductor with a band gap energy exceeding the higher energy of the nanorod, may also increase the band gap separation. Increasing the band gap separation may reduce DIBL and other short channel effects, including band-to-band tunneling induced off-state leakage.

FIG. 1A is a cross-section illustrating nanorod formation according to various embodiments of the invention. In many embodiments, substrate 101A comprises a silicon substrate, but substrate materials other than silicon, such as silicon germanium, may be used. In some embodiments, substrate 101A may comprise a wafer, such as a silicon wafer. In various embodiments, substrate 101A may comprise a silicon on sapphire or a silicon on insulator. The substrate 101A may also comprise an isoelectronic material such as isoelectronic silicon. Various embodiments include the substrate 101A with (001), (011) and (111) oriented crystal surfaces. In some embodiments, the substrate 101A may be cut and/or polished off-axis with an angle ranging from 0.5° to 15° relative to the on-axis cut surface normal (shown as Y).

The impurity and/or electrical carrier concentration in layer 102A may be adjusted to obtain the desired layer conductivity. For example, layer 102A may be a doped to provide an n-type conductivity. In some embodiments, the layer 102A may have p-type conductivity. In various embodiments, the layer 102A may be a substantially unintentionally doped (or undoped) layer. In various embodiments, the layer 102A may be of the same conductivity type as the substrate 101A. In some embodiments, the layer 102A has substantially the same electrical impurity concentration as the substrate 101A. In various embodiments, layer 102A is formed from the substrate 101A. In some embodiments, layer 102A may comprise a portion of the substrate 101A. In various embodiments, layer 102A may comprise an epitaxially grown or deposited film. In some embodiments, the impurity concentration and conductivity type of the layer 102A may be adjusted using ion implantation to achieve the desired electrical concentration.

The layer 103A may be formed on layer 102A and, in some embodiments, may be formed from layer 102A. The layer 103A may be formed using an epitaxial process or a deposition process. Layer 103A and layer 102A may be of the same or of a different conductivity type. In various embodiments, layer 103A is a substantially unintentionally doped layer. In some embodiments, layer 103A is a doped layer having an impurity concentration of less than $1\times10^{17}$ cm$^{-3}$. Examples of n-type impurities include P, As, and Sb. Examples of p-type impurities include B, Ga and In. In some embodiments, layer 103A may have an electrically active concentration of less than $1\times10^{17}$ cm$^{-3}$. In various embodiments, the impurity and/or electrically active concentration is graded in a direction substantially perpendicular to the surface normal. In various embodiments, the impurity and/or electrically active concentration is graded in a direction substantially parallel to the surface normal. In some embodiments, the impurity concentration and conductivity type of layer 103A may be adjusted using ion implantation to provide a particular electrical concentration. In some embodiments, layer 103A has substantially the same conductivity type as the substrate 101A. In various embodiments, layer 103A is formed from the substrate 101A. In some embodiments, layer 103A may form a portion of the substrate 101A. In various embodiments, layers 103A, 102A and substrate 101A may be formed from a single wafer such as a silicon wafer.

As shown in FIG. 1A, layer 105A may be formed on the surface of the layer 103A as a mask layer. Layer 105A may be formed in the shape of a line, square, circle or other geometry as desired. Layer 105A may be formed of any number of patternable materials such a photoresist, a metal, or a dielectric adaptable to various lithography processes. Spacers 104A may be formed adjacent to layer 105A using a suitable etch resistant material. In some embodiments, layer 104A may comprise, without limitation, a semiconductor material such as SiGe, SiC and SiGeC, a dielectric such as silicon nitride, an oxynitride and SiO$_2$, a polymer such as a photoresist, a block polymer such as diblock copolymer blends of polystyrene and polymethylmethacrylate, a metal such as W, MO, Ta and Al, or some combination of one or more layers of semiconductors, polymers, block polymers, dielectrics and metals. In various embodiments, the spacers 104A may be formed as a self-assembled layer in a shape of an annular ring. In some embodiments, the spacers may be formed as a self-assembled layer with an island-like profile. In various embodiment, the spacers 104A may be formed as a self-assembled layer forming a circular shaped hole. In some embodiment, the spacers 104A may be formed by a self-assembled layer process without the layer 105A.

Figure 1B:
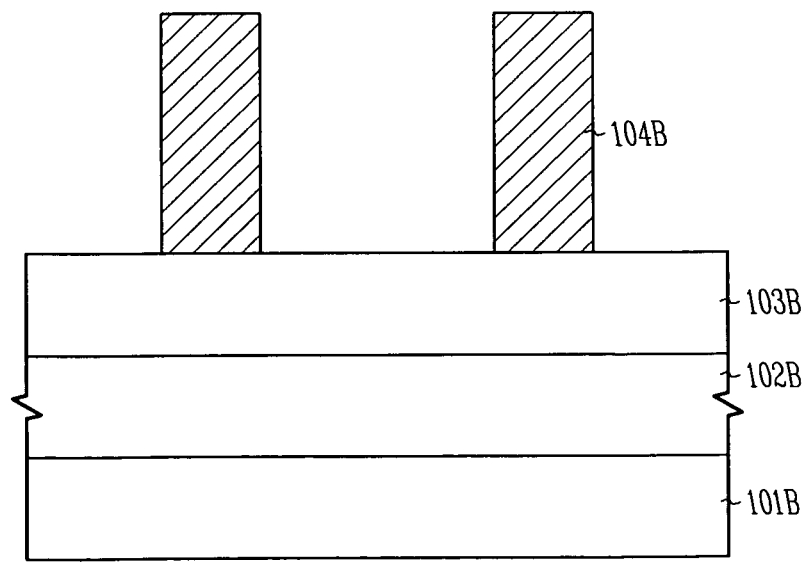

FIG. 1B is a cross-section illustrating nanorod formation according to various embodiments of the invention. Here, the layer 105A of FIG. 1A is shown removed, leaving spacers 104B substantially unchanged on layer 103B. At this point, layers 102B and/or 103B may be further processed as desired using for example, diffusion, implantation, and anneal processes to adjust the electrical and mechanical properties of the respective layers between the spacers 104B. In some embodiments, 102B and/or 103B may be further processed to adjust the electrical and mechanical properties of a portion of the respective layers directly under the spacers 104B using the spacers as a mask. In various embodiments, the electrical properties of the layer 102B may be adjusted to provide a conductive region adjacent to the spacers 104B. In various embodiments, the electrical properties of the layer 102B may be adjusted to form one or more shared doped regions extending, at least in part, laterally under the spacers 104B. In some embodiments, the electrical properties of the layer 102B may be adjusted to form a region contacting a doped region.

Figure 1C:
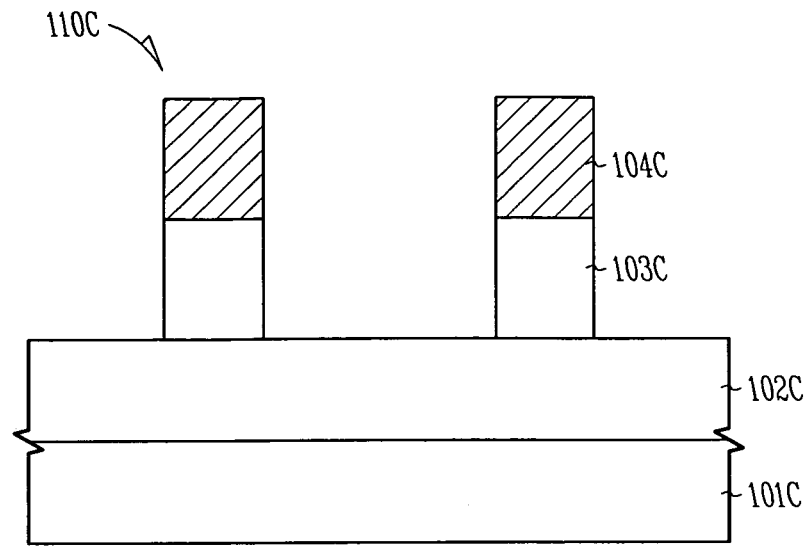

FIG. 1C is a cross-section illustrating nanorod formation according to various embodiments of the invention. Here, layer 103C and a portion of layer 102C are shown removed between the spacers 104C forming a vertical nanorod structure 110C. The material between the spacers 104C may be removed using an etch process, such as a wet chemical etch, a gas etch such as a plasma etch, and other suitable processes. In various embodiments, the depth of the etch may be less than 1 µm. Layer 103C of the vertical nanorod structure 110C forms the channel region and layer 102C forms a shared doped drain/source region of a transistor. In some embodiments, the channel portion of the vertical structure may be less than 0.5 µm.

Figure 1D:
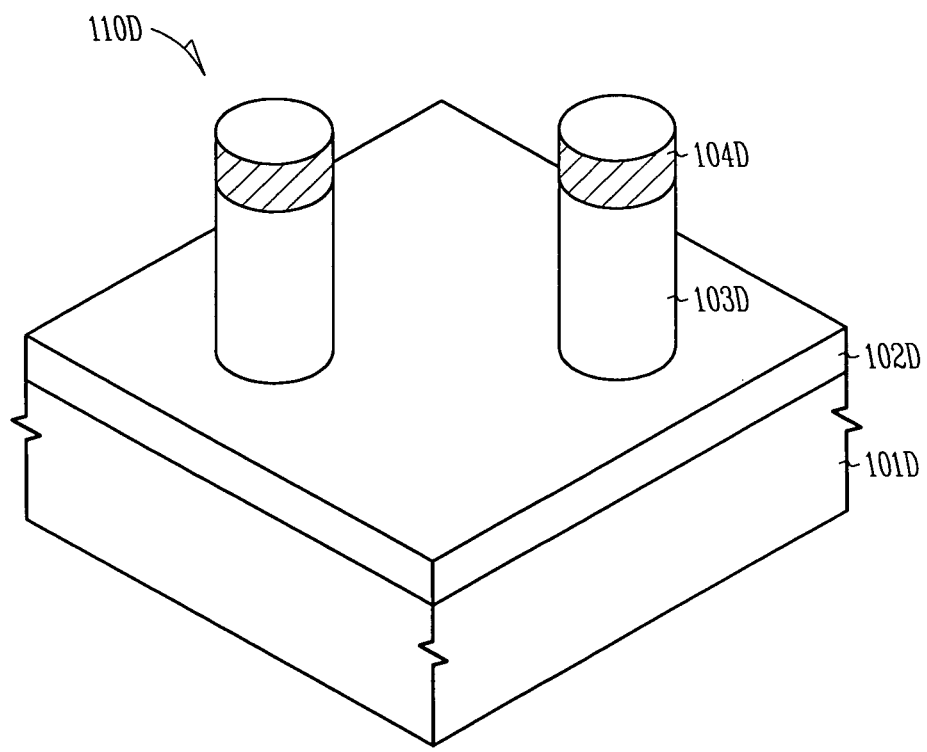
FIG. 1D is a perspective view of nanorods according to various embodiments of the invention.

The nanorods 110C may be formed as a pillars or columns and may have a lateral cross-section shaped substantially in the form of a disk presenting a vertical rod-like structure as illustrated in FIG. 1D.

FIG. 1D illustrates nanorods 110D formed according to various embodiments of the invention. The diameter of the layer 103D below the spacers 104C may range from about 0.5 nm to about 15 nm. In some embodiments, a diameter of the 103D layer below the spacers 104D may range from about 1 nm to about 10 nm. In general, the diameter may be chosen according to the desired energy band shift. In various embodiments, the layer 103D between the spacers 102D may be partially removed. In some embodiments, layers 102D, 103D and a portion of substrate material 101D may be removed between the spacers 104D such that there is no shared doped region using layer 102D without further processing (not shown).

In some embodiments, layers 102D and 103D are formed from the substrate material 101D. For example, layer 102D and 103D may be a portion of the substrate material 101D that is a semiconductor wafer. In various embodiments, substrate 101D is a single crystal silicon wafer. In some embodiments, layers 102D, 103D and 101D comprise silicon layers. In various embodiments, layer 102D and 103D may comprise SiGe layers. In some embodiments, layer 102D may be a SiGe layer and 103D may comprise a silicon layer. In various embodiments, layer 102D may comprise a silicon layer and 103D a SiGe layer. In some embodiments, layer 102D and/or layer 103D may comprise a SiC layer or a SiGeC layer.

Figure 2A:
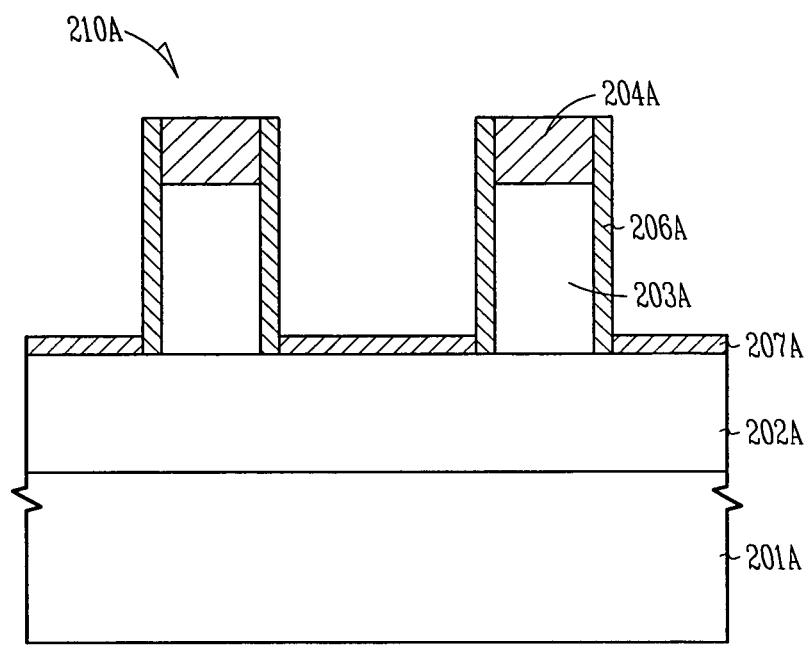
FIGS. 2A-B are cross-sections illustrating a MOSFET according to various embodiments of the invention.

FIG. 2A is cross-section illustrating a MOS transistor according to various embodiments of the invention. Here, the vertical nanorod 210A is first formed, then a gate dielectric 206A is formed in contact with the channel region 203A of the vertical nanorods. Insulator 207A may be formed between the nanorods over layer 202A. An optional field insulator may be further formed between the nanorods (not shown). The gate dielectric 206A may be formed along the sides of the nanorods 210A surrounding or enclosing the channel region. In some embodiments, the insulator 207A and the gate dielectric 206A are formed of the same dielectric material. In various embodiments, the insulator 207A and the gate dielectric 206A may be different materials. Examples of gate dielectric materials include, without limitation, $SiO_2$, SiN, and nitrides and oxynitrides formed with Si, Mo, W, Ta, Hf, and Al. In some embodiments the gate dielectric may comprise a composite multi-layer dielectric. The thickness of the gate dielectric 206A may range from about 2 nm to about 20 nm, depending on the gate dielectric material and related properties such as a dielectric constant. In some embodiments, the insulator 207A and the gate dielectric 206A may be formed with the same thickness or with different thicknesses.

Figure 2B:
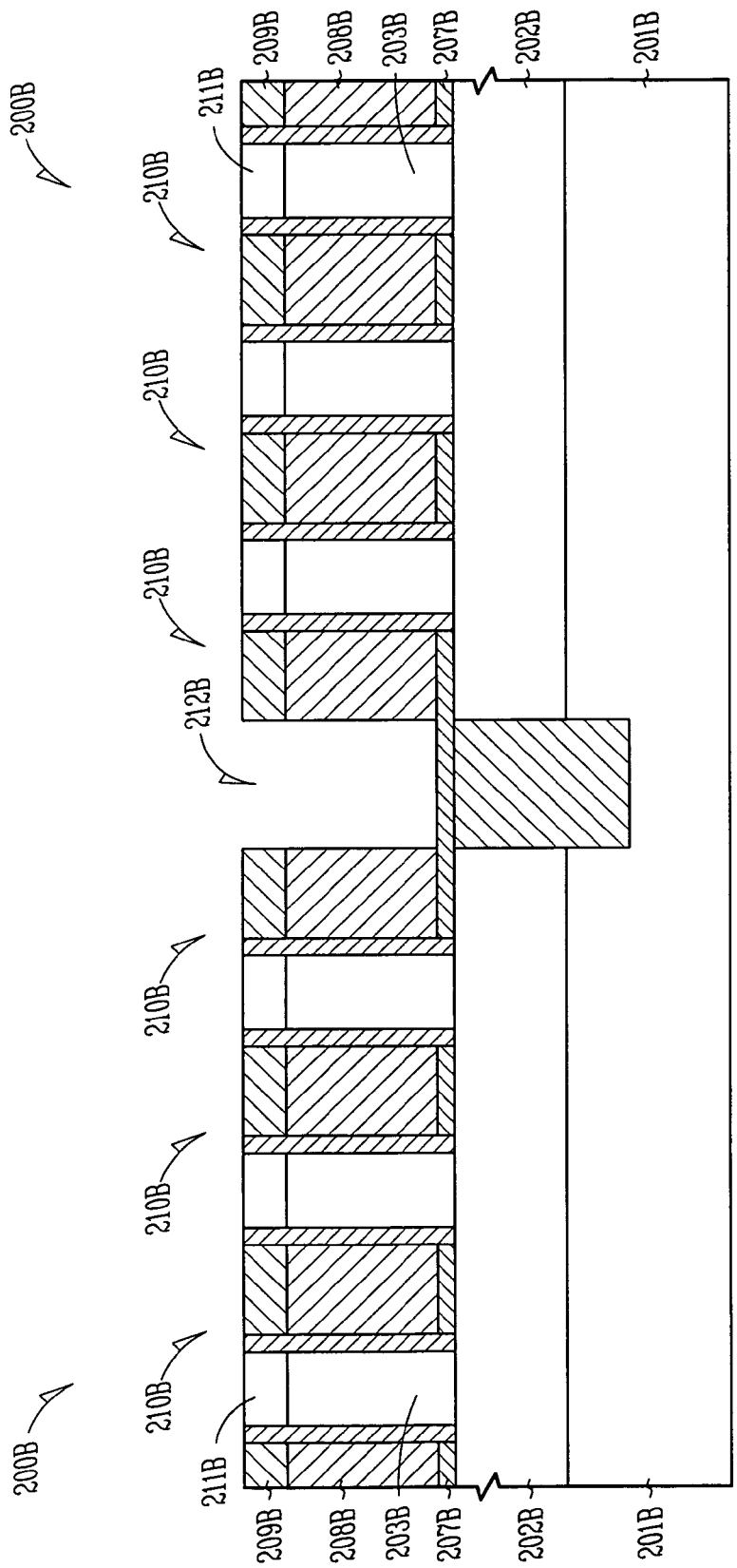

FIG. 2B is cross-section illustrating a MOS transistor according to various embodiments of the invention. Here, two access transistors 200B are shown separated by an isolation region 212B formed on the substrate 201B. The isolation region 212B may be a shallow trench isolation region formed in the shared drain/source region 202B to electrically isolate the access transistors 200B. Isolation region 212B may be an etched region filled with a dielectric material such as vapor deposited $SiO_2$. In some embodiments, the isolation region 212B may be formed in a portion of the substrate 201B. The access transistors include the vertical nanorods 210B with a drain/source region 211B at one end of the nanorod in contact with channel region 203B, and a shared drain/source region 202B at the second end in contact with the channel region. In some embodiments, an isolation region may used to electrically isolate a plurality of vertical nanorods configured in parallel to form a vertical channel transistor. In some embodiments, the length of the vertical channel region 203B may be less than 250 nm. In various embodiments, the length of the vertical channel region 203B may be between about 20 nm and about 150 nm.

The gate conductor 208B may be formed over the gate dielectric 206B that surrounds the nanorods in the channel region 203B. The gate region may be formed as a shared conductive gate region by filling-in the area between the nanorods 210B with a suitable conductive material. In some embodiments, the gate region may be formed such that there is no shared gate region. Examples of conductive gate region materials include, but are not limited to, polysilicon, metals such as Al, W, Mo and Ta, binaries such as TiN and TaN, metal silicides such as $WSi_x$, NiSi, $CoSi_x$ and $TiSi_x$, a dacecamine, and combinations of layers of conductive material. Field insulator 209B may be formed overlaying gate conductor 208B and may comprise any suitable insulator, including, without limitation, $SiO_2$, SiN, and oxynitride-based dielectrics containing Si, Al, W, Ta, Ti, and Mo.

Drain/source region 211B and shared source/drain region 202B may be configured to be in electrical contact using the vertical channel region 203B of the nanorods such that no current flows across the channel region with zero gate bias voltage applied to gate conductor 208B. Drain/source region 211B may be formed by epitaxial growth, ion implantation, and deposition processes. In some embodiments, the drain/source region 211B may be formed as a shared region. In various embodiments, drain/source region 211B may comprise silicon, doped polysilicon, SiC, SiGe or SiGeC. A substantially planar surface may be obtained for the field dielectric 209B and drain source region 211B using a chemical mechanical process as are known to those of ordinary skill in the art. In various embodiments, a conductive region overlaying insulator 209B and the drain/source region 211B may be formed to couple the nanorods 210B (not shown).

Figure 3:
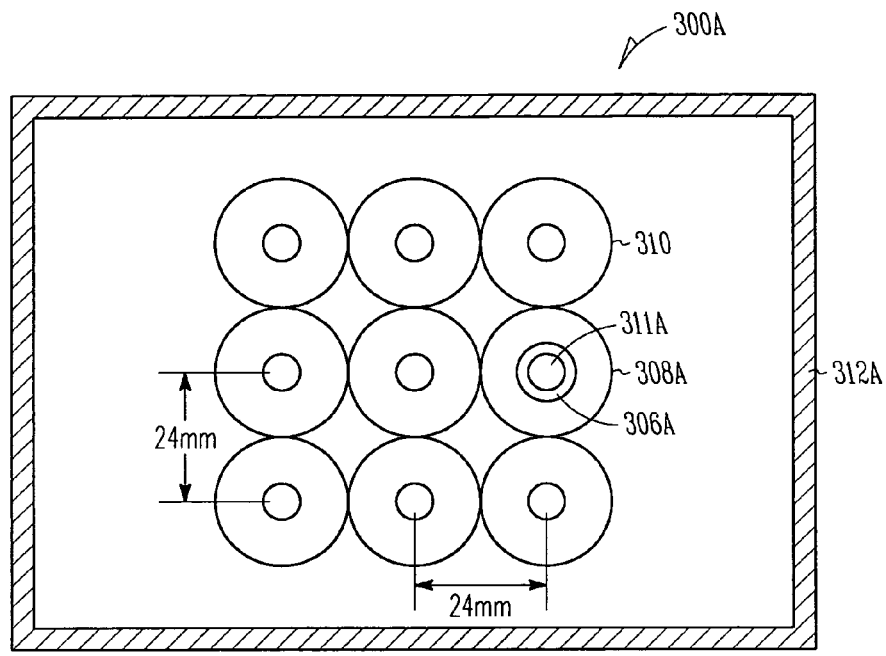
FIG. 3 is a surface view illustrating a MOSFET according to various embodiments of the invention.

FIG. 3 is a surface view of a MOS transistor according to various embodiments of the invention. Here, the access transistor 300 is shown with nine nanorods 310 and an isolation region 312, but may include more or less nanorods. The vertical channel region 203B of FIG. 2B coupled to the drain/source region 302 form a composite of parallel channels, which may be electrically coupled to a capacitor at 311 (not shown). In some embodiments, the isolation region 312 may be used electrically isolate a plurality of vertical channel regions. In various embodiments, the isolation region 312 may be used to electrically isolate the vertical channel regions of an access transistor 300 from the vertical channel regions of an adjacent access transistor 300. In some embodiments, the isolation region 312 may be used to isolate a capacitor coupled to the access transistor 300 from adjacent capacitor cells (not shown). As show by way of example in FIG. 3, but not by limitation, a shared annular gate arrangement of nine nanorods 310 may be formed with a center-to-center spacing of 24 nm using vertical nanorod channels (not shown) having about a 10 nm diameter, a gate dielectric 306 with about a 2 nm radial thickness and gate conductor 308 with about a 5 nm radial thickness. Various embodiments include a gate dielectric thicknesses ranging from about 2 nm to about 20 nm, channel region diameters ranging from about 0.5 nm to about 15 nm, and conductive gate region thicknesses ranging from about 3 nm to about 10 nm. The number of parallel coupled nanorods and/or channels formed as part of the access transistor, or other such transistor, may affect desired performance characteristics. In general, the number of vertical channels per surface area may be determined and adjusted according to specified design rules for a particular manufacturing process.

Figure 4:
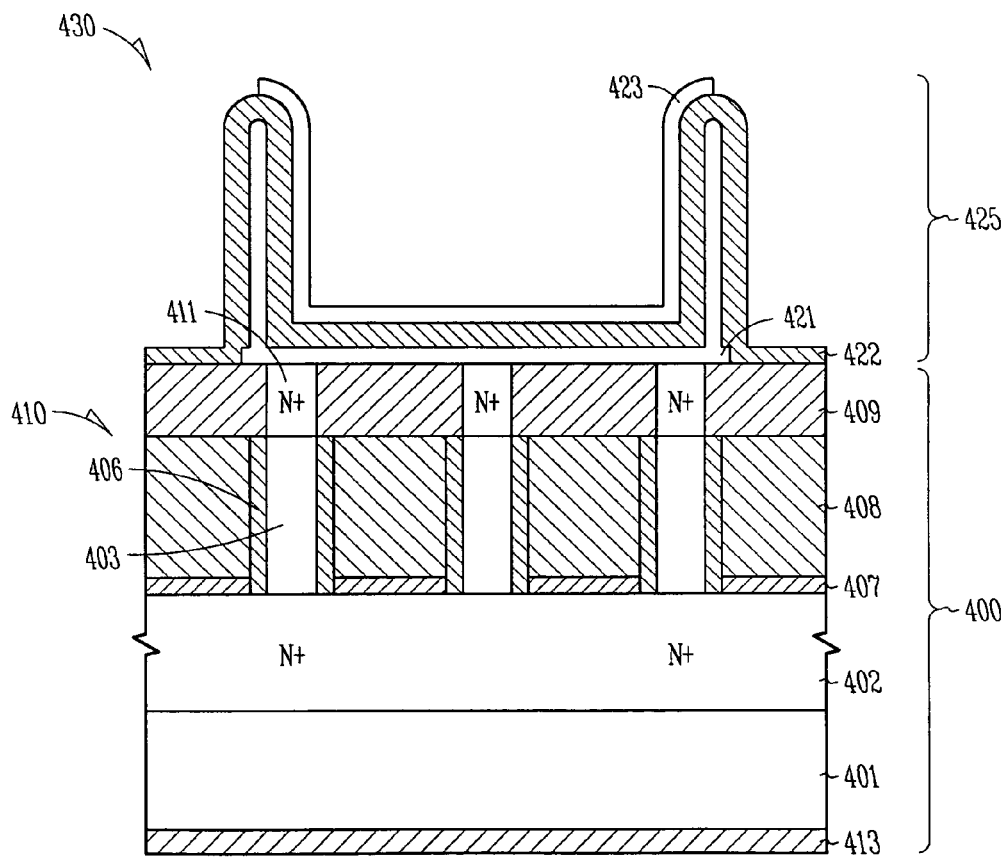
FIG. 4 is a cross-section illustrating a memory cell according to various embodiments of the invention.

FIG. 4 is a cross-section illustrating a memory cell according to various embodiments of the invention. Here, a DRAM cell 430 includes an access transistor 400 and double-sided capacitor 425, but any type of capacitor may be configured to be supported by and/or coupled to the access transistor. The double-sided capacitor stores electrical charge received from an input circuit (not shown) such that the charge establishes an electric field across the insulator 422 between capacitor plates 421 and 423. More information regarding fabrication of storage cell capacitors can be found in U.S. Pat. No. 6,030,847 entitled Method for Forming a Storage Capacitor Compatible with High Dielectric Constant Material, and U.S. patent application Ser. No. 10/788,977 entitled Semiconductor Fabrication Using a Collar, both incorporated by reference herein in their entirety.

In various embodiments, and as shown in FIG. 4, the n-type drain/source region 411 of the access transistor 400 are in contact the nanorod channels 403 and capacitor plate 421. The electric charge supporting the electric field between capacitor plates 421 and 423 may place each drain/source region 411 in contact with capacitor plate 421 at substantially equal potential. In this case, charge may not flow though the vertical channel region 403 of any nanorod 410 in the absence of a bias potential on gate conductor 408. In some embodiments, the gate conductor 408 shared a conductor coupling the gate region of one or more nanorods. Thus, the gate conductor 408 may comprise multiple discrete gate electrodes coupled using a conductor. The vertical channel 403 of the nanorods 410 may be sufficiently small in diameter so that the electronic band gap energy of the material in the channel region 403 is greater than in the non-channel regions, such as in the unetched portion of the n-type drain/source region 402 and the substrate layer 401. In various embodiments, the substrate 401, the n-type shared drain/source region 402, the channel region 403 and/or the n-type drain/source region 411 are formed from a material with the same lattice constant. In some embodiments, the substrate 401, the shared drain/source region 402, the channel region 403 and/or the drain/source region 411 are formed of silicon. In various embodiments, the drain/source region 411 is made sufficiently large to eliminate quantum size effects, such as a higher energy band gap shift. In some embodiments, the drains/source region 411 may be shared drains/source region. In various embodiments, a portion of the shared drain/source region 402 is made sufficiently large to eliminate quantum size effects in that portion. In some embodiments, the shared drain/source region 402 is coupled to the ground plane 413 using via holes (not shown). In various embodiments, the shared source drain region 402 may be used as a ground plane or a similar conductive region. In some embodiments, the substrate is coupled to the ground plane 413. In various embodiments, the substrate forms at least a part of a conductive plane such as a ground plane. In some embodiments, an electrical isolation region (not shown) may be formed in the substrate between the nanorods 410. In various embodiments, the substrate may comprise an electrically non-conductive material such as a silicon wafer with a low carrier concentration. In some embodiments, the ground plane 413 may comprise a series of ground planes. In various embodiments, the ground plane 413 is formed as a plurality of conductors coupled to one or more conductors, electrodes, circuit element, voltages and the like.

Charge placed on the capacitor 425 by a voltage signal transmitted by conductor from an input/output circuit (not shown), for example, may be stored during the access transistor's off-state since no further current path is provided. For the memory cell illustrated in FIG. 4, the charge may be used to establish an electric field in the vertical direction between the capacitor plate 421 and the conductive ground plane 413. A portion of the electric field may have a vertical potential gradient across the channel region 403 of the nanorods 410 of the access transistor 400 between the source/drain regions 402, 411. In the absence of voltage applied to the gate conductor 408, substantially no current flows between drain/source regions 402, 411 (off-state).

Application of a voltage to the gate conductor 408 may establish an electric field across gate dielectric 406 with field components perpendicular to the channel 403. A gate voltage in cooperation with the gate dielectric layer 406 may further generate a charge inversion layer (not shown) extending inward from the gate dielectric along the channel 403 between drain/source regions 402, 411. The charge inversion layer may electrically couple the drain/source regions 402, 411 to form a current path there between. In some embodiments, the nanorods may have a circular cross-section and the electric field includes a radial potential gradient. The formation of a current path between the capacitor plate 421 in contact with the drain/source region 411 and the shared drain/source region 402 and/or substrate 401 and/or conductive ground plane 413, may allow the capacitor 425 to discharge through the channel region, removing the capacitor's charge and the respective voltage and electric field.

In the transistor off-state, the energy band discontinuity (or energy band offset) between the capacitor plate 421 and the channel region 403 may be larger with the nanorods 410 than for a transistor channel formed from the same material with a bulk band gap energy (e.g. without nanorods). This increased energy band offset may provide an increased electron barrier for blocking electrons thereby reducing the amount of charge escaping the capacitor plate 421 though the channel region 403. The increased energy band gap difference between the source/drain region 402 and the channel region 403 may reduce DIBL by improving the sub-threshold ideality factor and sub-threshold voltage swing. Consequently, a reduction in the amount of charge leaking from the capacitor 425 over time may occur through the access transistor 400. As a result, the DRAM cell 430 may retain charge for longer times.

Figure 5:
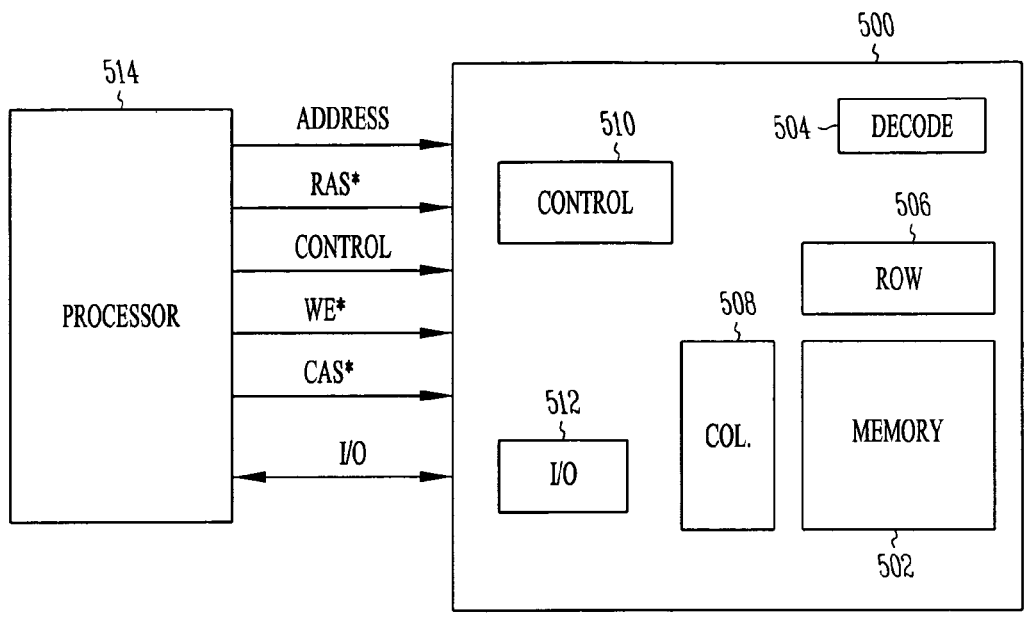
FIG. 5 is block diagram of a memory device according to various embodiments of the invention.

FIG. 5 is block diagram of a memory device 500 according to various embodiments of the invention. The memory device 500 may include an array of memory cells 502, an address decoder 504, row access circuitry 506, column access circuitry 508, control circuitry 510, and an input/output (I/O) circuit 512. The memory cells 502 may comprise one or more capacitor cells operatively coupled to the row access circuit 506 and the column access circuit. The memory device 500 may be operably coupled to an external processor 514, or memory controller (not shown) to provide access to the memory content. The memory device 500 is shown to receive control signals from the processor 514, such as WE*, RAS* and CAS* signals. The memory device 500 may store data which is accessed via I/O lines. It will be appreciated by those of ordinary skill in the art that additional circuitry and control signals can be provided, and that the memory device of FIG.

5 has been simplified to help focus on, and not obscure, various embodiments of the invention. Any of the memory cells, transistors, and associated circuitry may include an integrated circuit structure and/or elements in accordance with various embodiments of the invention. For example, the array of memory cells 502 may be fabricated according to embodiments of the invention, so as to include one or more nanorods, as shown in FIG. 1D.

It should be understood that the above description of a memory device 500 is intended to provide a general understanding of possible memory structures, and is not a complete description of all the elements and features of a specific type of memory, such as DRAM. Further, many embodiments of the invention are equally applicable to any size and type of memory circuit and are not intended to be limited to the DRAM described above. Other alternative types of devices include SRAM (static random access memory) and flash memories. Additionally, the DRAM could comprise a synchronous DRAM, commonly referred to as SGRAM (synchronous graphics random access memory), SDRAM (synchronous DRAM), SDRAM II, and DDR SDRAM (double data rate SDRAM), as well as Synchlink™ or Rambus™ DRAMs and other technologies.

Figure 6:
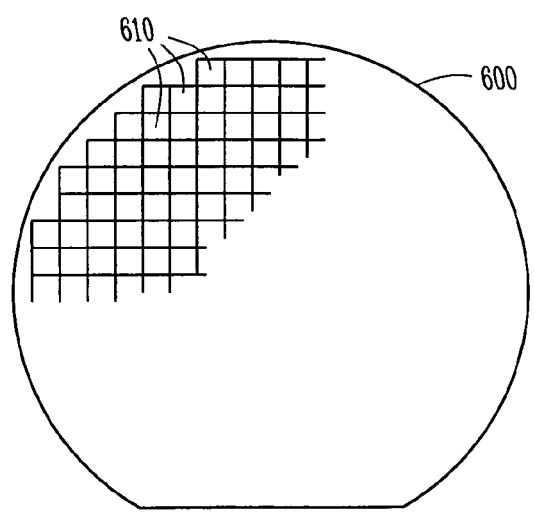
FIG. 6 illustrates a semiconductor wafer according to various embodiments of the invention.

FIG. 6 illustrates a semiconductor wafer 600 according to various embodiments of the invention. As shown, a semiconductor die 610 may be produced from a wafer 600. The semiconductor die 610 may be individually patterned on a substrate layer or wafer 600 that contains circuitry, or integrated circuit devices, to perform a specific function. The semiconductor wafer 600 may contain a repeated pattern of such semiconductor dies 610 containing the same functionality. The semiconductor die 610 may be packaged in a protective casing (not shown) with leads extending therefrom (not shown), providing access to the circuitry of the die for unilateral or bilateral communication and control. The semiconductor die 610 may include an integrated circuit structure or element in accordance with various embodiments of the invention, including one or more nanorods, as shown in FIG. 1D.

Figure 7:
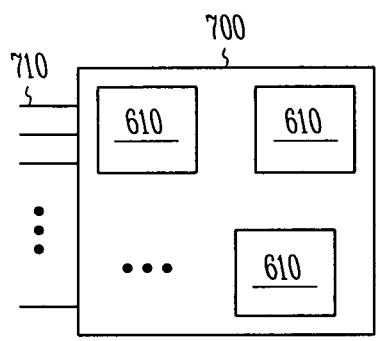
FIG. 7 illustrates a circuit module according to various embodiments of the invention.

FIG. 7 illustrates a circuit module 700 according to various embodiment of the invention. As shown in FIG. 7, two or more semiconductor dice 610 may be combined, with or without a protective casing, into a circuit module 700 to enhance or extend the functionality of an individual semiconductor die 610. The circuit module 700 may comprise a combination of semiconductor dice 610 representing a variety of functions, or a combination of semiconductor dies 610 containing the same functionality. One or more semiconductor dice 610 of circuit module 700 may contain at least one integrated circuit structure or element in accordance with embodiments of the invention, including one or more nanorods, as shown in FIG. 1D.

Some examples of a circuit module include memory modules, device drivers, power modules, communication modems, processor modules and application-specific modules, and may include multilayer, multichip modules. The circuit module 700 may be a subcomponent of a variety of electronic systems, such as a clock, a television, a cell phone, a personal computer, a personal digital assistant, a network server such as a file server or an application server, an automobile, an industrial control system, an aircraft and others. The circuit module 700 may have a variety of leads 710 extending therefrom and coupled to the semiconductor dice 610 providing unilateral or bilateral communication and control.

Figure 8:
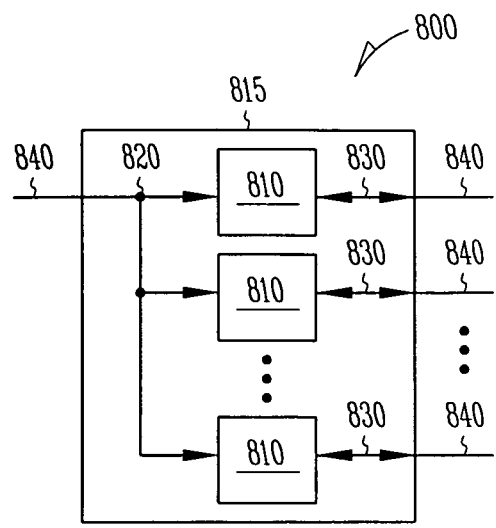
FIG. 8 is a block diagram illustrating a circuit module as a memory module according to various embodiments of the invention.

FIG. 8 illustrates a circuit module as a memory module 800, according to various embodiment of the invention. A memory module 800 may include multiple memory devices 810 contained on a support 815 (the number generally depending upon the desired bus width and the desire for parity checking). The memory module 800 may accept a command signal from an external controller (not shown) on a command link 820 and provide for data input and data output on data links 830. The command link 820 and data links 830 may be connected to leads 840 extending from the support 815. The leads 840 are shown for conceptual purposes and are not limited to the positions shown in FIG. 8. At least one of the memory devices 810 may contain an integrated circuit structure or element in accordance with embodiments of the invention, including one or more nanorods, as shown in FIG. 1D.

Figure 9:
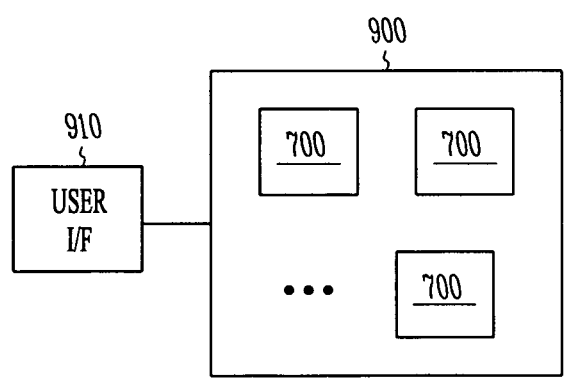
FIG. 9 is a block diagram illustrating an electronic system according to various embodiments of the invention.

FIG. 9 illustrates a block diagram of an electronic system 900 according to various embodiment of the invention. FIG. 9 shows an electronic system 900 containing one or more circuit modules 700. The electronic system 900 may include a user interface 910 that provides a user of the electronic system 900 with some form of control or observation of the results generated by the electronic system 900. Some examples of a user interface 910 include a keyboard, a pointing device, a monitor or printer of a personal computer; a tuning dial, a display or speakers of a radio; an ignition switch, gauges or gas pedal of an automobile; and a card reader, keypad, display or currency dispenser of an automated teller machine, as well as other human-machine interfaces.

The user interface 910 may further include access ports provided to electronic system 900. Access ports are used to connect an electronic system 900 to the more tangible user interface components previously provided by way of example. One or more of the circuit modules 700 may comprise a processor providing some form of manipulation, control or direction of inputs from or outputs to the user interface 710, or of other information either preprogrammed into, or otherwise provided to, the electronic system 900. As will be apparent from the lists of examples previously given, the electronic system 900 may be associated with certain mechanical components (not shown) in addition to the circuit modules 700 and the user interface 910. It should be understood that the one or more circuit modules 700 in the electronic system 900 can be replaced by a single integrated circuit. Furthermore, the electronic system 900 may be a subcomponent of a larger electronic system. It should also be understood by those of ordinary skill in the art, after reading this disclosure that at least one of the memory modules 700 may contain an integrated circuit structure or element in accordance with embodiments of the invention, including one or more nanorods, as shown in FIG. 1D.

Figure 10:
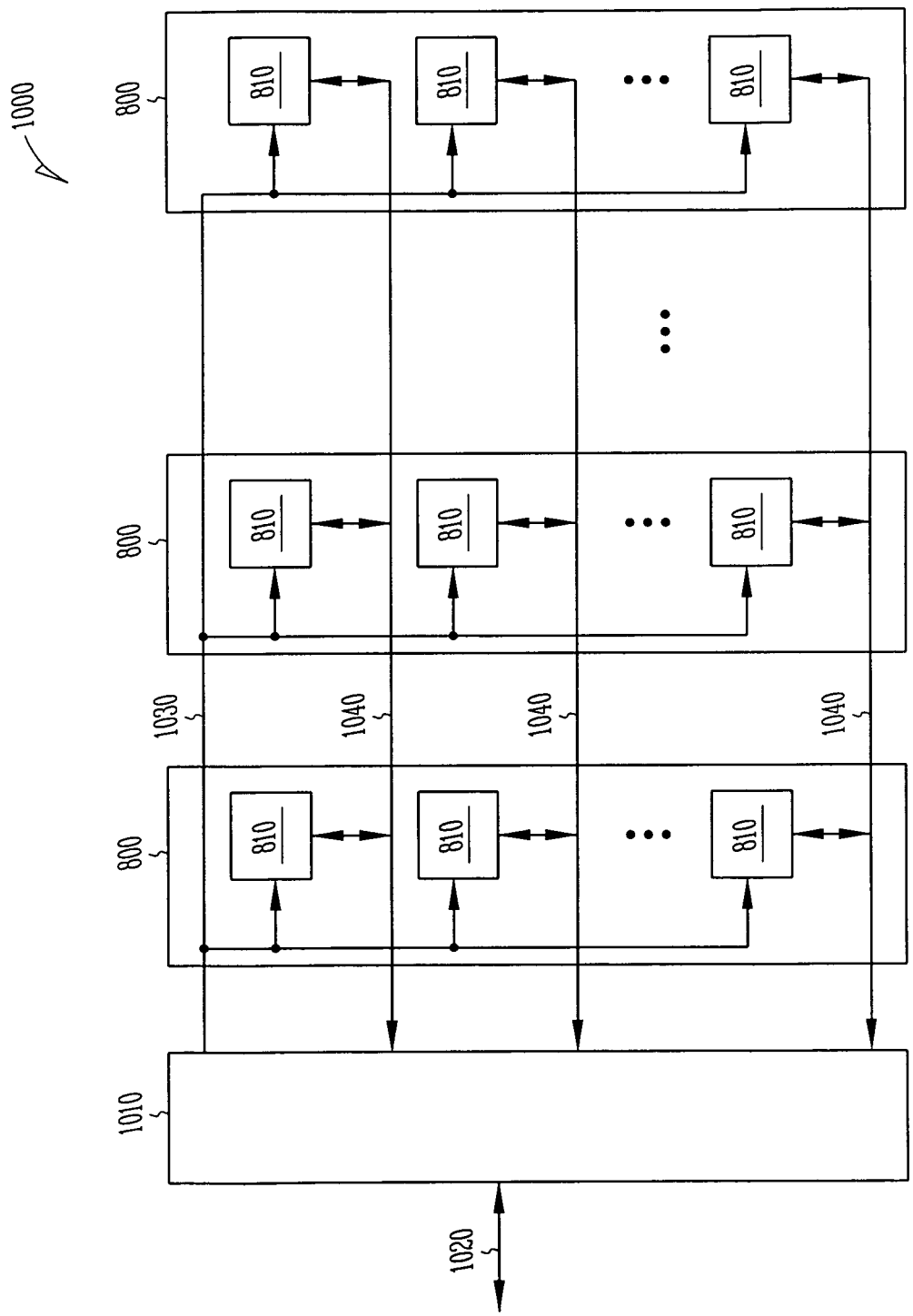
FIG. 10 is a block diagram illustrating an electronic system as a memory system according to various embodiments of the invention.

FIG. 10 illustrates a block diagram of an electronic system as a memory system 1000 according to various embodiment of the invention. A memory system 1000 may contain one or more memory modules 800 and a memory controller 1010. The memory modules 800 may each contain one or more memory devices 810. At least one of memory devices 810 may contain an integrated circuit structure or element in accordance with embodiments of the invention, including one or more nanorods, as shown in FIG. 1D.

The memory controller 1010 may provide and control a bidirectional interface between the memory system 1000 and an external system bus 1020. In some embodiments, the memory controller 1010 may also contain one or more nanorods, as shown in FIG. 1D. The memory system 1400 may accept a command signal from the external system bus 1020 and relay it to the one or more memory modules 800 on a command link 830. The memory system 1000 may provide data input and data output between the one or more memory modules 800 and the external system bus 1020 on data links 1040.

Figure 11:
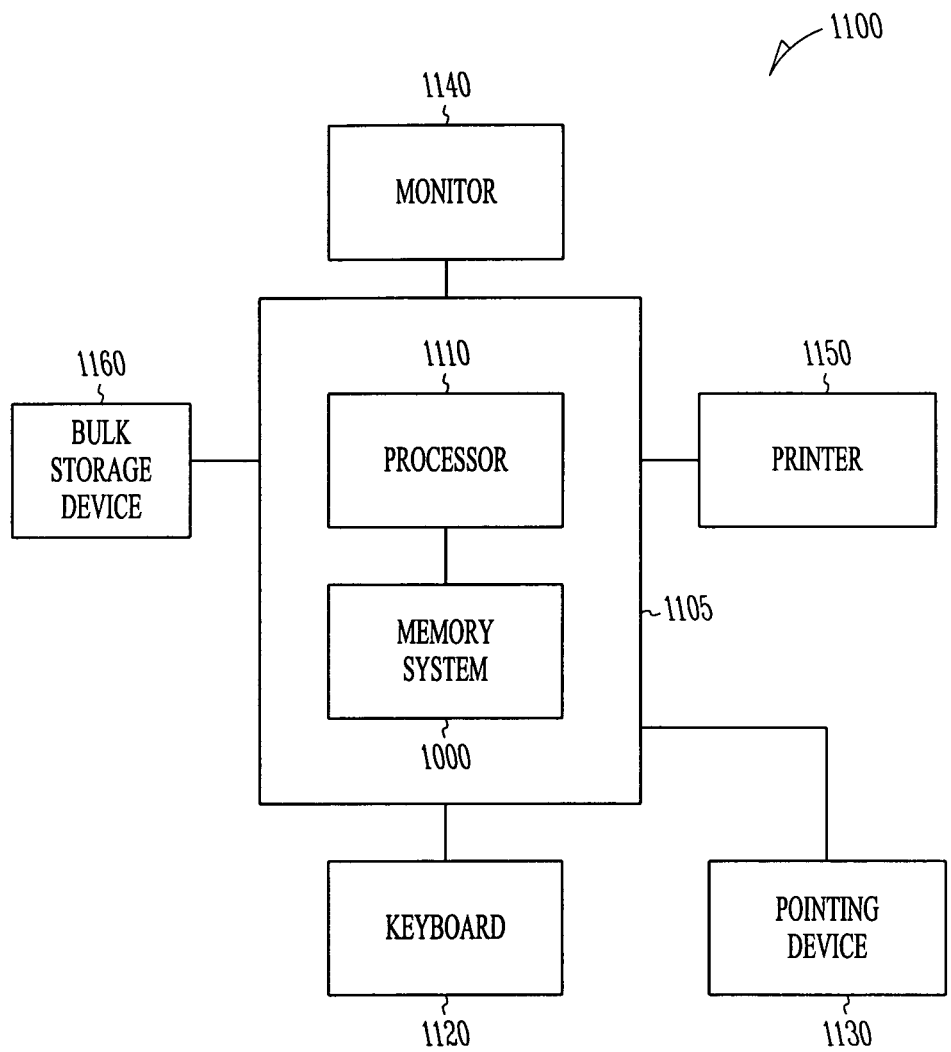
FIG. 11 is a block diagram illustrating an electronic system as a computer system according to various embodiments of the invention.

FIG. 11 illustrates a block diagram of an electronic system as a computer system 1100 according to various embodiment of the invention. A computer system 1100 may contain a processor 1110 and a memory system 1000 housed in a computer unit 1105. The computer system 1100 also serves as an example of an electronic system containing another electronic system, i.e., memory system 1000, as a subcomponent. The computer system 1100 optionally contains user interface components, such as a keyboard 1120, a pointing device 1130, a monitor 1140, a printer 1150 and a bulk storage device 1160. Other components associated with the computer system 1100, such as modems, device driver cards, additional storage devices, etc. may also be included. The processor 1110 and the memory system 1000 of the computer system 1100 can be incorporated on a single integrated circuit. Such single package processing units may operate to reduce the communication time between the processor and the memory circuit. The processor 1110 and the memory system 1000 may contain one or more nanorods, as shown in FIG. 1D. In some embodiments, the printer 1150 or the bulk storage device 1160 may contain an integrated circuit structure or element in accordance with embodiments of the invention, including one or more nanorods, as shown in FIG. 1D.

The above Detailed Description includes references to the accompanying drawings, which form a part of the detailed description. The drawings show, by way of illustration, specific embodiments. These embodiments, which are also referred to herein as "examples," are described in enough detail to enable those skilled in the art to practice the invention. The embodiments may be combined, other embodiments may be utilized, or structural, logical and electrical changes may be made without departing from the scope of the present invention. The Detailed Description is, therefore, not to be taken in a limiting sense, and the scope of the various embodiments is defined only by the appended claims and their equivalents.

In this document, the terms "a" or "an" are used, as is common in patent documents, to include one or more than one. In this document, the term "or" is used to refer to a nonexclusive or, unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

It is to be understood that the above description is intended to be illustrative, and not restrictive. For example, the above-described embodiments (and/or aspects thereof) may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72 (b), which requires that it allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. A memory cell, comprising:
   a vertical channel comprising at least one nanorod that includes a vertical transport region of a semiconductor material, the vertical channel coupled at a first end of the vertical channel to a capacitor, the vertical channel configured to increase a native band gap energy of the semiconductor material forming the channel, wherein the semiconductor material consists of a SiGeC layer contacting and extending vertically from a SiC layer;
   a dielectric substantially surrounding the vertical channel; and
   a field electrode coupled to the vertical channel using the dielectric.

2. The memory cell of claim 1, wherein the capacitor is a double-sided capacitor associated with a dynamic random access memory.

3. The memory cell of claim 1, wherein the vertical channel is coupled to the capacitor using at least one shared doped region.

4. The memory cell of claim 3, wherein the at least one doped region is formed from a silicon substrate.

5. The memory cell of claim 1, wherein the vertical channel includes a channel portion with a substantially circular cross-section.

6. The memory cell of claim 5, wherein the substantially circular cross-section has a diameter of between about 0.5 nm to about 15 nm.

7. The memory cell of claim 1, wherein the field electrode is configured to regulate a discharge current associated with the capacitor.

8. The memory cell of claim 1, wherein a length of the vertical channel is less than 250 nm.

9. The memory cell of claim 1, wherein the dielectric is configured to support an electric field along the vertical channel to couple a charge at the first end with a shared doped region.

10. A memory unit, comprising:
    a channel region comprising at least one nanorod, wherein the at least one nanorod includes a vertical transport region of semiconductor material, the semiconductor material of the vertical transport region having a band gap energy increased from its native band gap energy in bulk form, wherein the semiconductor material consists essentially of a SiGeC layer contacting and extending vertically from a SiC layer;
    a gate region encompassing at least a portion of the at least one nanorod in the vertical transport region;
    a dielectric contacting the channel region, the dielectric including one or more oxynitrides of Mo, W, Ta, Hf, or Al; and a first drain/source region coupled to the at least one nanorod at an end supporting a capacitor cell.

11. The memory unit of claim 10, wherein the first drain/source region has a size sufficiently large such that the first drain/source region is without quantumize effects.

12. The memory unit of claim 10, wherein the channel region is on and contacting a second drain/source region, the second drain/source region coupled to a ground plane by a via through a substrate on which components of the memory unit are disposed.

13. The memory unit of claim 10, wherein the channel region is configured to reduce an off-state leakage current associated with the capacitor cell.

14. The memory unit of claim 10, wherein the gate region includes a shared gate material comprising at least one of a gate dielectric and a gate conductor.

15. The memory unit of claim 10, wherein the gate region is configured to use a common gate electrode.

16. The memory unit of claim 10, wherein a diameter of the at least one nanorod is between about 0.5 nm and about 20 nm.

17. The memory unit of claim 10, the channel region, the gate region, the dielectric, and the first drain/source region are disposed on a single crystal silicon substrate.

18. The memory unit of claim 10, wherein the channel region is coupled to a second drain/source region.

19. The memory unit of claim 18, wherein at least one of the second drain/source region or the least one nanorod is formed from a single crystal semiconductor substrate.

20. The memory unit of claim 10, wherein the vertical transport region includes at least one of a silicon, silicon germanium, or a silicon carbide.

21. The memory unit of claim 10, wherein the gate region includes a material comprising at least one of a metal and a polysilicon.

22. The memory unit of claim 10, wherein the capacitor cell is coupled to at least one of a row access circuit and a column access circuit.

23. A memory cell comprising:
an access transistor adjacent to a substrate layer, the access transistor comprising at least one vertical channel shaped as a nanorod that includes a vertical transport region of semiconductor material, the at least one vertical channel configured to increase a native band gap energy of the semiconductor material forming the vertical channel, the at least one vertical channel sharing a gate electrode and at least one drain/source region with another vertical channel, the at least one vertical channel substantially surrounded by a dielectric, wherein the semiconductor material consists of a SiGeC layer contacting and extending vertically from a SiC layer; and
a capacitor coupled to one end of the access transistor.

24. The memory cell of claim 23, wherein the gate electrode encloses a region including a quantized band gap energy.

25. The memory cell of claim 23, wherein the at least one vertical channel is formed from the substrate layer.

26. The memory cell of claim 23, wherein the substrate layer is a silicon wafer.

27. The memory cell of claim 23, wherein the at least one vertical channel, the substrate layer, and the at least one drain/source region are formed with materials having the same lattice constant.

28. The memory cell of claim 23, wherein the at least one vertical channel, the substrate layer, and the at least one drain/source region are a formed of a single material.

* * * * *

UNITED STATES PATENT AND TRADEMARK OFFICE
CERTIFICATE OF CORRECTION

PATENT NO.         : 8,643,087 B2                        Page 1 of 1
APPLICATION NO.    : 11/524343
DATED              : February 4, 2014
INVENTOR(S)        : Gurtej S. Sandhu et al.

It is certified that error appears in the above-identified patent and that said Letters Patent is hereby corrected as shown below:

On the Title Page

On page 2, in item (56), under "Other Publications", in column 2, line 7, delete "Applicaiton" and insert -- Application --, therefor.

On page 2, in item (56), under "Other Publications", in column 2, line 27, delete "maiied" and insert -- mailed --, therefor.

In the Claims

In column 13, line 5, in Claim 11, delete "quantumize" and insert -- quantum size --, therefor.

In column 13, line 21, in Claim 17, delete "the" and insert -- wherein the --, therefor.

In column 13, line 27, in Claim 19, after "or the" insert -- at --.

In column 14, line 32, in Claim 28, after "are" delete "a".

Signed and Sealed this
Thirteenth Day of May, 2014

Michelle K. Lee
*Deputy Director of the United States Patent and Trademark Office*